United States Patent [19]

Takiba et al.

[11] Patent Number: 4,988,894
[45] Date of Patent: Jan. 29, 1991

[54] POWER SUPPLY SWITCHING CIRCUIT

[75] Inventors: Akira Takiba; Hiroyoshi Murata; Yasoji Suzuki, all of Yokohama; Isao Abe, Kawasaki, all of Japan

[73] Assignee: Kabushiki Kaisha Toshiba, Kawasaki, Japan

[21] Appl. No.: 365,739

[22] Filed: Jun. 14, 1989

[30] Foreign Application Priority Data

Jun. 16, 1988 [JP] Japan .................................. 63-149156

[51] Int. Cl.⁵ ...................... H03K 3/01; H03K 17/687
[52] U.S. Cl. ................................. 307/296.1; 307/571; 365/226
[58] Field of Search ............................ 307/296.1, 571; 365/226, 189.03, 189.11

[56] References Cited

U.S. PATENT DOCUMENTS

| | | | |
|---|---|---|---|
| 3,936,676 | 2/1976 | Fujita | 307/296.1 |
| 4,441,172 | 4/1984 | Ebel | 365/226 |
| 4,616,143 | 10/1986 | Miyamoto | 365/226 |
| 4,658,156 | 4/1987 | Hashimoto | 365/226 |

OTHER PUBLICATIONS

D. Novosel, et al., *A 1Mb CMOS EPROM With Enhanced Verificiation*, "1988 IEEE International Solid State Circuits Conference", Feb. 1988, pp. 124-125.
S. Tanaka, et al., *A Programmable 256K CMOS EPROM With ON-Chip Test Circuits*, "1984 IEEE International Solid State Circuits Conference", pp. 148-149.

*Primary Examiner*—Stanley D. Miller
*Assistant Examiner*—Richard Roseen
*Attorney, Agent, or Firm*—Foley & Lardner, Schwartz, Jeffery, Schwaab, Mack, Blumenthal & Evans

[57] ABSTRACT

A power supply switching circuit includes first to third MOS transistors (P1, P2 and P3) connected in series between a high-potential source and a standard-potential source. The circuit performs a switching operation using a standard-potential and at least one potential which is different from the standard-poential, and outputs plural power supply potentials. The third MOS transistor (P3) is inserted between the first and second MOS transistors (P1 and P2). The back gate of the third transistor (P3) is connected to an output terminal (OUT1) formed between the second transistor (P2) and the third transistor (P3) and prevents the formation of a current path via turned-off transistor (P1) due to the action of a parasitic diode in the first and second transistors caused by potential fluctuations.

4 Claims, 5 Drawing Sheets

POWER SUPPLY SWITCHING CIRCUIT

BACKGROUND OF THE INVENTION

This invention relates to a CMOS, and more particularly, to a power supply switching circuit.

In an LSI using an EPROM and the like, it is necessary to apply a potential which is higher than a power supply potential ($V_{DD}$) for writing while in the write mode, and to use the standard potential and a potential which is higher than the standard potential as power supplies and to switch them.

Heretofore, as a circuit for switching power supplies as described above, there is, for example, a power supply switching circuit shown in FIG. 4.

This conventional circuit includes a first p-channel MOS transistor P1 and a second p-channel MOS transistor P2 which are connected in series, and a high potential $V_{PP}$ is supplied from IN2 to the source of the first p-channel MOS transistor P1, and a standard potential ($V_{DD}$) is supplied from a terminal 10 to the drain of the second p-channel MOS transistor P2.

An input terminal IN1, to which control signals are input, is connected to the input of a level shifter 8, through which the gate of the first p-channel MOS transistor P1 is connected. The input terminal IN1 is also connected to the gate of an inverter circuit 7 which comprises a p-channel MOS transistor P4 and an n-channel MOS transistor N5.

An output terminal OUT1 is connected to a connection point of the drain of the first MOS transistor and the source of the second MOS transistor, and grounded at GND0 via the p-channel MOS transistor P4 and is the n-channel MOS transistor N5. The gate of the second MOS transistor P2 is connected to a connection point of the p-channel MOS transistor P4 and the n-channel MOS transistor N5.

Now, the operation of this power supply switching circuit of the prior art will be explained.

An input signal is applied to the input terminal IN2 at the potential level $V_{PP}$ which is higher than the standard potential ($V_{DD}$).

The level shifter 8 is inserted for completely turning off the first p-channel MOS transistor P1 when the level "$V_{DD}$" is input to the input terminal IN1, and is a circuit which outputs the level IN2 when the level "$V_{DD}$" is input to the input terminal IN1, and outputs the level "GND" when the level "GND" is input.

First, when the level "GND" is input to the input terminal IN1, the level "GND", which is an output of the level shifter 8, is applied to the gate of the first p-channel MOS transistor P1, and the first p-channel MOS transistor P1 is turned on. Accordingly, a connection point 6 (node) of the drain of the first MOS transistor P1 and the source of the second MOS transistor P2 comes to the level "$V_{PP}$".

Furthermore, since the level "GND" is applied to the gate of the n-channel MOS transistor N5 of the inverter 7 connected to the input terminal IN1, the n-channel MOS transistor N5 is turned off. The level "GND" is also applied to the gate of the p-channel MOS transistor P4 connected to the input terminal IN1, and since the node 6 is at the level "$V_{PP}$", the p-channel MOS transistor P4 is turned on. The gate of the secOnd MOS transistor P2 comes to the level "$V_{PP}$" via the turned-on p-channel MOS transistor P4, and the second MOS transistor P2 is completely turned off. Consequently, the level "$V_{PP}$" is output from the output terminal OUT1.

When the level "$V_{DD}$" is input to the input terminal IN1, the level "$V_{PP}$", which is an output of the level shifter 8, is applied to the gate of the first p-channel MOS transistor P1, and the first p-channel MOS transistor P1 is turned off. Furthermore, since the level "$V_{DD}$" is applied to the gate of the n-channel MOS transistor N5 of the inverter 7 connected to the input terminal IN1, the n-channel MOS transistor N5 is turned on. The gate of the second p-channel MOS transistor P2 then becomes at the level "GND", and the second p-channel MOS transistor P2 is turned on. Hence, the node 6 comes to the level "$V_{DD}$". Since the gate and the source of the p-Channel MOS transistor P4 are both at the level "$V_{DD}$", the p-channel MOS transistor P4 is turned off. Hence, the level "$V_{DD}$" of the node 6 is output as it is from the output terminal OUT1.

As described above, in the power supply switching circuit of the prior art shown in FIG. 4, the level "$V_{PP}$" is output when the level "GND" is input to the input terminal IN1, and the level "$V_{DD}$" is output from the output terminal OUT1 when the level "$V_{DD}$" is input to the input terminal IN1.

When a potential applied to the high-potential input terminal IN2 is at a level equivalent to or higher than the level "$V_{DD}$", no forward-direction bias is applied to a parasitic diode D1 which exists between a source diffusion region (p-type) and an n-well of the first p-channel MOS transistor P1 as shown in FIG. 5, and so no current flows.

However, when a potential applied from the input terminal IN2 is lower than the level "$V_{DD}$", although the first p-channel MOS transistor P1 is turned off, a forward-direction bias is applied to the parasitic diode D1 to conduct it. Hence, a current path is formed between the $V_{DD}$ and the IN2 via the first and second p-channel MOS transistors P1 and P2, and the output level from the output terminal OUT1 decreases.

Since there exists the above-described inconvenience when a potential applied from the input terminal IN2 is lower than the level "$V_{DD}$", a high-potential input signal and other input signals can not use the terminal IN2 in common, and it is necessary to provide exclusive terminals for respective inputs.

SUMMARY OF THE INVENTION

The present invention has been made on the basis of the above-described background. It is an object of the present invention to provide a power supply switching circuit in which an input terminal can be used in common for other input signals, in a semiconductor device, such as a CMOS.LSI and the like, having inputs of many potential levels.

After performing research and development for solving the above-described problems, the inventor has found that, by further providing a third MOS transistor between a first MOS transistor and an output terminal OUT, the third MOS transistor is turned off even when a potential applied from an input terminal is lower than the level "$V_{DD}$", a reverse bias is applied to a parasitic diode to suppress the above-described conduction and securely maintain an output level from the output terminal OUT without decreasing the level, and it is possible to use the input terminal in common for other input signals, and thus completed the present invention.

That is, a power supply switching circuit of the present invention is a power supply switching circuit comprising first and second MOS transistors which are connected in series, for outputting a power supply potential by switching using a standard potential and at least one kind of potential which is different from the standard potential.

The invention includes a third MOS transistor between the first and second MOS transistors. The source of the third MOS transistor is connected to the drain of the first MOS transistor, the drain of the third MOS transistor is connected to the source of the second MOS transistor, and the back gate of the third MOS transistor is connected to an output.

A connection point of the drain of the third MOS transistor and the source of the second MOS transistor is made an output.

A high potential or a low potential is supplied to the source of the first MOS transistor, and a standard potential is supplied to the drain of the second MOS transistor.

In a preferred aspect of the present invention, the first, second and third MOS transistors may be p-channel transistors, and a high potential may be supplied to the source of the first MOS transistor.

In the aspect of providing p-channel transistors and supplying a high potential to the source of the first MOS transistor, a gate signal of the second MOS transistor may be made an output signal of an inverter comprising MOS transistors in which an output is from a source.

Furthermore, in the aspect of providing p-channel transistors and supplying a high potential to the source of the first MOS transistor, a gate signal of the first MOS transistor may be supplied from a level shifter which outputs a high potential or a ground potential.

In another aspect of the present invention, the first, second and third MOS transistors may be n-channel transistors, and a low potential may be supplied to the source of the first MOS transistor.

The function of the power supply switching circuit according to the present invention will be schematically explained.

In the power supply switching circuit of the present invention, the third MOS transistor is newly provided between the first and second MOS transistors. That is, the third MOS transistor is provided between the first MOS transistor and the output terminal OUT. Hence, the third MOS transistor is turned off even when a potential applied from the input terminal is lower than the level "$V_{DD}$" of the standard potential, and a reverse bias is applied to a parasitic diode which exists between a source diffusion region and an n-well of the third MOS transistor to suppress conduction between the standard potential and the input terminal.

DESCRIPTION OF THE PREFERRED EMBODIMENTS

The present invention will be further explained with reference to the drawings.

Figure 1:
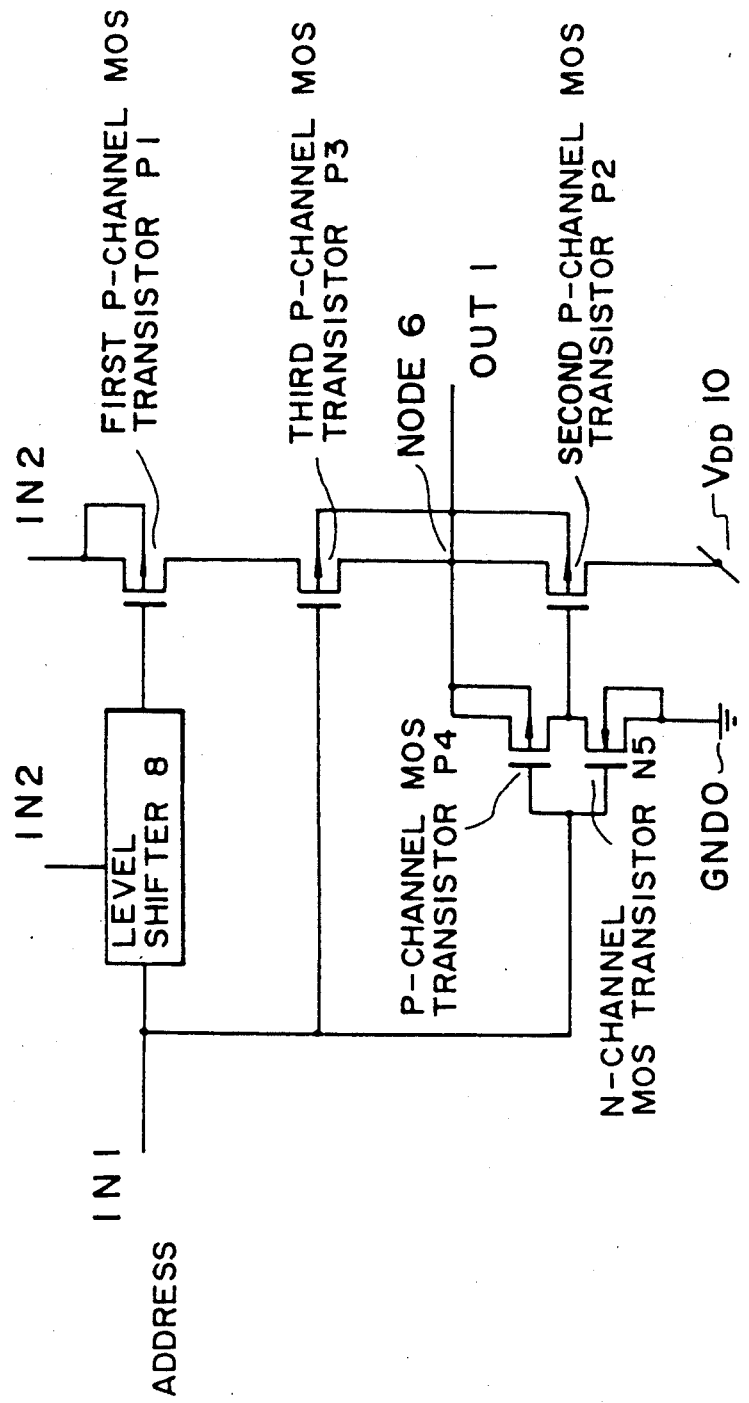
FIG. 1 is a circuit configuration diagram showing an embodiment of a power supply switching circuit according to the present invention.
Figure 2:
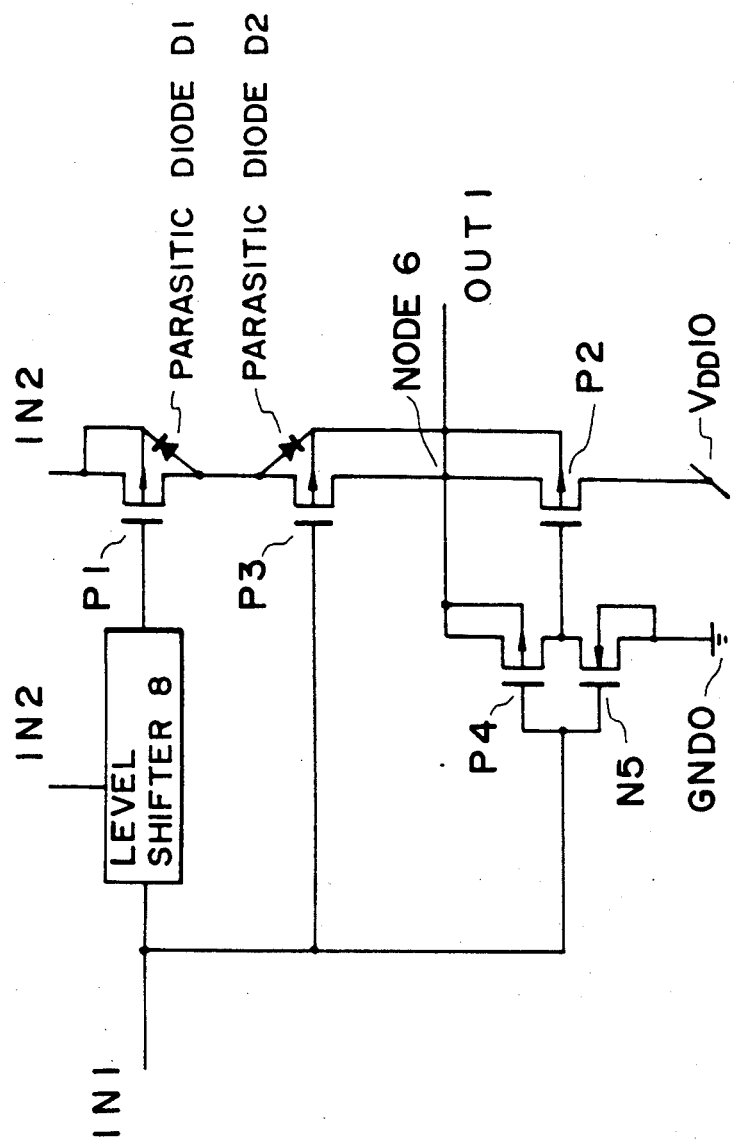
FIG. 2 is an explanatory diagram of the circuit shown in FIG. 1.

FIG. 1 is a circuit configuration diagram of an embodiment according to the present invention, and FIG. 2 is a circuit configuration diagram for explaining the function of the circuit of the embodiment.

A power supply switching circuit of the embodiment comprises a first MOS transistor P1 and a second MOS transistor P2 which are connected in series, and a third MOS transistor P3 between the first and second MOS transistors P1 and P2. The drain of the first MOS transistor P1 is connected to the source of the third MOS transistor P3, the source of the second MOS transistor P2 is connected to the drain of the third MOS transistor P3, and the back gate of the third MOS transistor is connected to an output OUT1. A connection point 6 of the drain of the third MOS transistor P3 and the source of the second MOS transistor P2 is made to the output OUT1, a high potential $V_{PP}$ is supplied to the source of the first MOS transistor P1 as input IN2, and a standard potential $V_{DD}$ is supplied to the drain of the second MOS transistor P2.

Accordingly, the output OUT1 is connected to IN2 via the transistors P3 and P1, to a standard potential $V_{DD}$ 10 via the transistor P2, and also to GND0 via transistors P4 and N5 which constitute an inverter circuit 7.

On the other hand, an input terminal IN1 for control signals is connected to the input of a level shifter 8, to the gate of the third p-channel MOS transistor P3, and also to the gate of the inverter circuit comprising the transistors P4 and N5.

Furthermore, the gate of the first p-channel MOS transistor P1 is connected to the output of the level shifter 8, and the gate of the second p-channel MOS transistor P2 is connected to a connection point of the p-channel MOS transistor P4 and the n-channel MOS transistor N5.

The level shifter 8 is inserted for completely turning off the first p-channel MOS transistor P1 when the level "$V_{DD}$" is input to the input terminal IN1, and is a circuit which outputs the level IN2 when the level "$V_{DD}$ is input to the input terminal IN1, and outputs the level "GND" when the level "GND" is input.

Next, the operation of the circuit of the embodiment according to the present invention will be explained.

When a potential "$V_{PP}$" which is no lower than the level "$V_{DD}$" is applied to the IN2, the operation is as follows.

First, when a potential of the level "GND" is applied to the IN1, the gates of the first p-channel MOS transistor and the third p-channel MOS transistor P3 both becomes at the level "GND", the both transistors are turned on, and the node 6 becomes at the "$V_{PP}$". At this time, since a potential of the level "GND" is applied to the gate of the n-channel MOS transistor N5, the transistor N5 is turned off. Since a potential of the level "GND" is also applied to the gate of the p-channel MOS transistor P4, and the node 6 is at the level "$V_{PP}$", the transistor P4 is turned on. The gate of the second p-channel MOS transistor P2 comes to the level "$V_{PP}$", and the transistor P2 is completely turned off. Hence, the level "$V_{PP}$" is output at the output terminal OUT1.

Next, when the level "$V_{DD}$" is applied to the IN1, the gate of the first p-channel MOS transistor P1 comes to the level "$V_{PP}$", and the transistor P1 is turned off. Since the gate of the n-channel MOS transistor N5 comes to the level "$V_{DD}$", the transistor N5 is turned on, and since the gate of the second p-channel MOS transistor P2 comes to the level "GND", the second p-channel MOS transistor P2 is turned on. Hence, the node 6 comes to the level "$V_{DD}$". At this time, since both the gate of the p-channel MOS transistor P4 and the node 6 are at the level "$V_{DD}$", the transistor P3 is turned off.

Furthermore, since both the gate of the third p-channel MOS transistor P3 and the node 6 are at the level "$V_{DD}$", the third p-channel MOS transistor P3 is turned off. Hence, a potential of the level "$V_{DD}$" is output at the OUT1.

A case in which a potential which is lower than the level "$V_{DD}$" is applied to the IN1 will be hereinafter explained with reference to FIG. 2.

When a potential of the level "$V_{DD}$" is applied to the IN1, the gate of the n-channel MOS transistor N5 comes to at the level "$V_{DD}$", the transistor N5 is turned on, and the gate of the second p-channel MOS transistor P2 comes to at the level "GND". Hence, the second p-channel MOS transistor P2 is turned on. Consequently, the node 6 comes to at the level "$V_{DD}$", and since the gate of the transistor P4 is at the level "$V_{DD}$", the transistor P4 is turned off. In this aspect, the gate of the third p-channel MOS transistor P3 is at the level "$V_{DD}$" and the transistor P3 is turned off. Furthermore, since a potential which is lower than the level "$V_{DD}$", is applied to the IN2, and the node 6 is at the level "$V_{DD}$", a parasitic diode D2 which exists between a source diffusion region (p-type) and n-well of the transistor P3 is reverse-biased, and the transistor P3 is not conducting. Hence, irrespective of the condition of the MOS transistor P1, it is possible to interrupt by the transistor P3 a current path between the level "$V_{DD}$" 10 of the standard potential and the high-potential input terminal IN2 via the transistors P1, P3 and P2. Accordingly, it becomes possible to suppress a decrease in the output level at the output terminal OUT1 which is a disadvantage of the conventional power supply switching circuit, and to securely output the level "$V_{DD}$" at the OUT1.

The present invention is not limited to the above-described aspects, but various modified aspects are possible within the scope of the invention.

Figure 3:
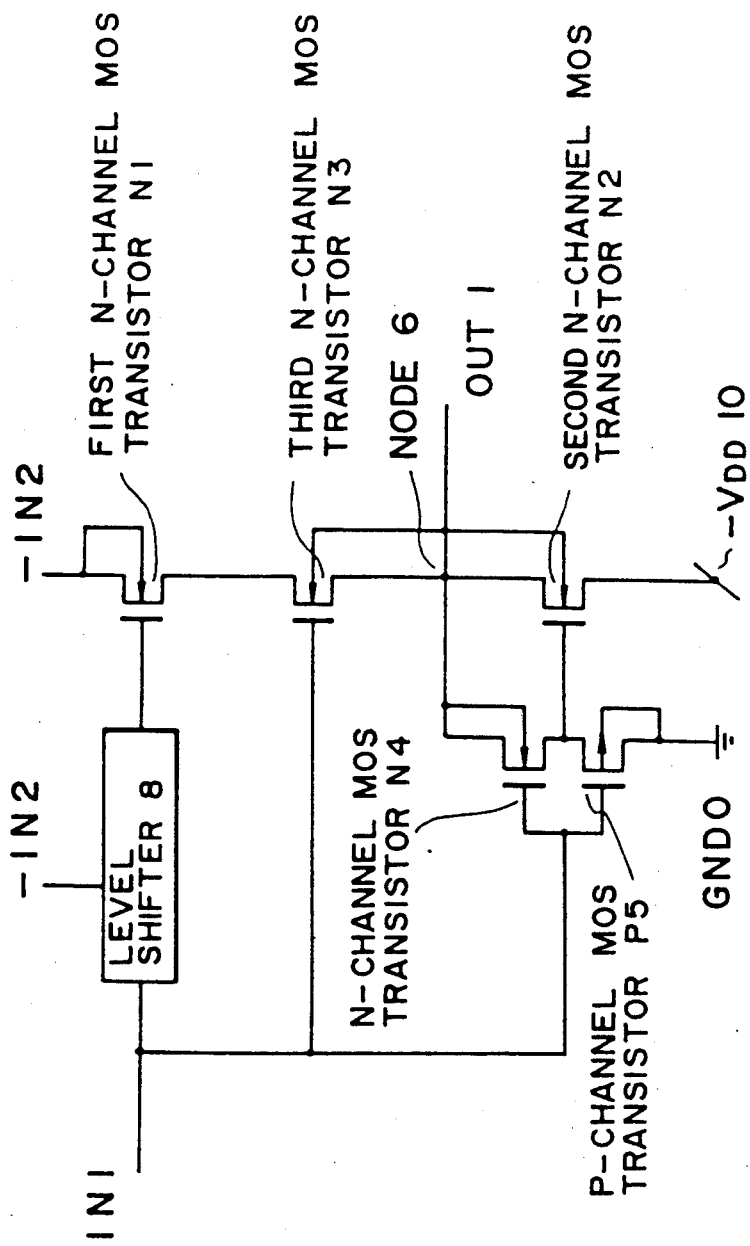
FIG. 3 is a circuit configuration diagram showing a modified example of a power supply switching circuit according to the present invention.
Figure 4:
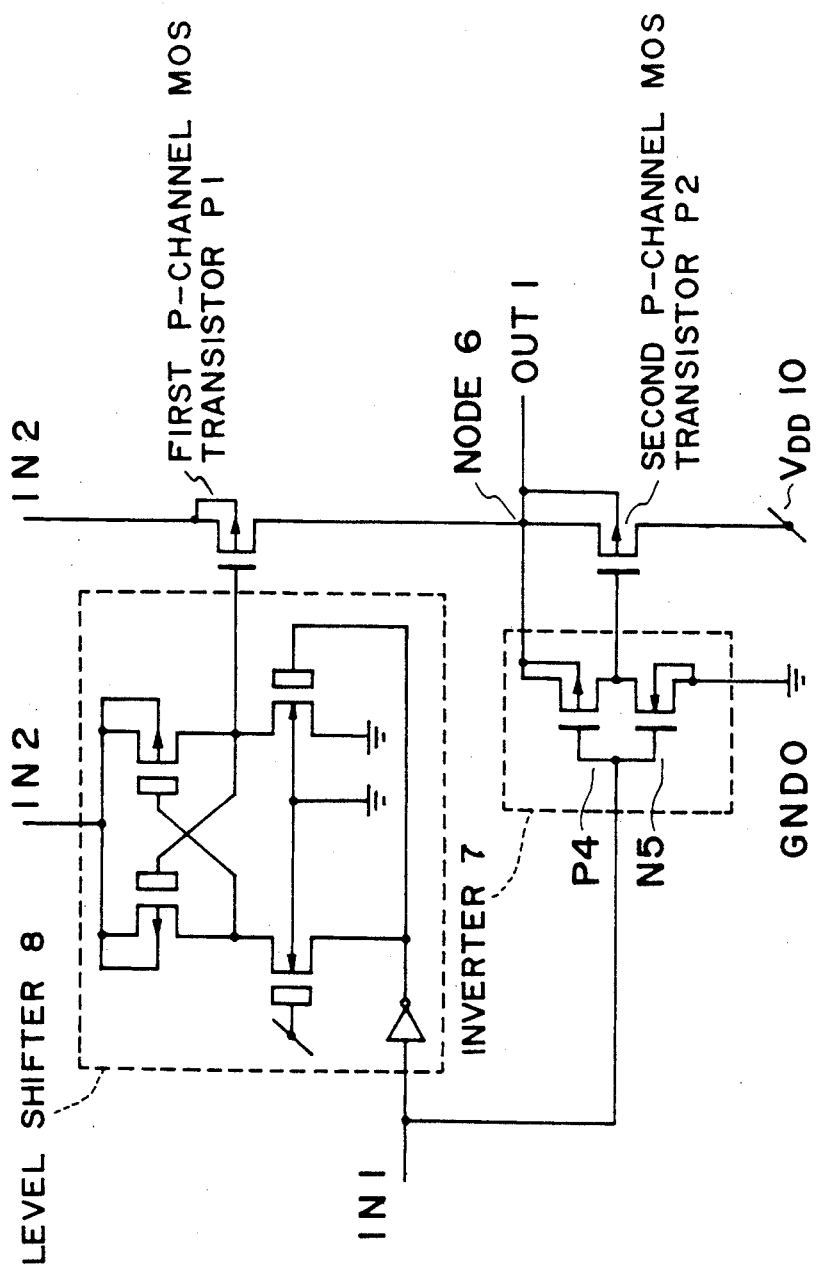
FIG. 4 is a circuit configuration diagram showing an example of a power supply switching circuit of the prior art.
Figure 5:
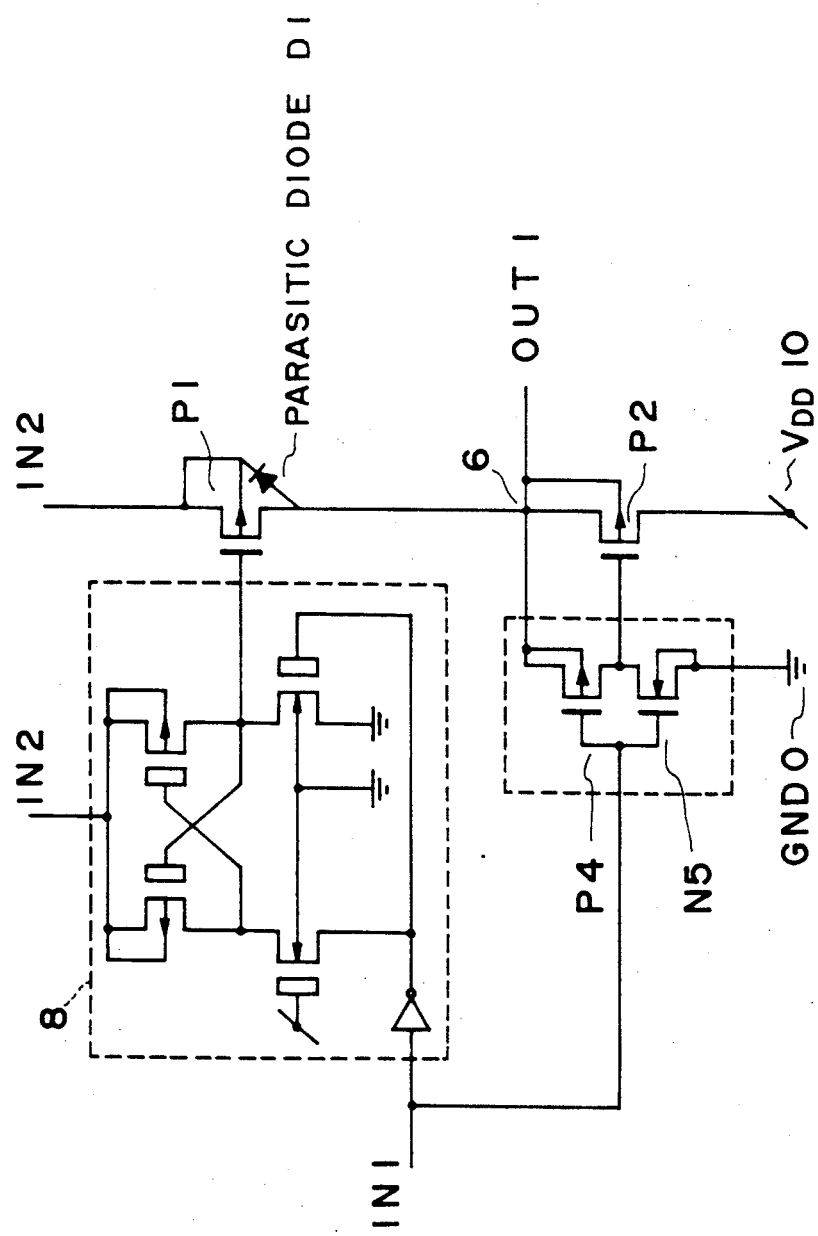
FIG. 5 is an explanatory diagram for explaining disadvantages of the circuit example shown in FIG. 4.

For example, the present invention can be applied to an aspect in which a low potential, such as a negative power supply or the like, is used instead of a high-potential power supply. As an example thereof, p-channel and n-channel transistors may be replaced by n-channel and p-channel transistors, respectively, as shown in FIG. 3.

Furthermore, the level shifter 8 may be of any type provided that it can completely turn off the first MOS transistor P1. The third MOS transistor P3 may also have an arbitrary structure, provided that it effectively interrupts a current path between the level "$V_{DD}$" 10 of the standard potential and the high-potential or low-potential input terminal IN2.

The power supply switching circuit of the present invention has the following effects.

In a power supply switching circuit according to claim 1, a third MOS transistor is provided between a first MOS transistor and an output terminal OUT. Hence, the third MOS transistor is turned off even when a potential applied from an input terminal IN2 is lower than the level "$V_{DD}$" of a standard potential. Furthermore, a reverse bias is applied to a parasitic diode which exists between a source diffusion region and an n-well of the third MOS transistor to suppress a conduction between the standard potential and the input terminal. Accordingly, it makes it possible to securely output the level "$V_{DD}$" at the OUT1, even when the potential applied from the input terminal is lower than the level "$V_{DD}$" of the standard potential.

Although an exclusive terminal for applying a high potential is necessary in a conventional circuit, an input terminal for the high-potential level "$V_{PP}$" and other input terminals for different potentials can be used in common in a power supply switching circuit. Hence, the present invention is effective in reducing the number of pins.

In a power supply switching circuit, the present invention can also be applied to an aspect in which a low potential, such as a negative potential and the like, is used, and an input terminal for a low potential level and other input terminals for different potentials can be used in common. Hence, the present invention is similarly effective in reducing the number of pins.

What is claimed is:

1. A power supply switching circuit comprising:
   first, second, and third MOS transistors mutually connected in series such that said third MOS transistor is located between said first and second MOS transistors, wherein an output terminal is formed between said second MOS transistor and said third MOS transistor, and wherein a first potential is supplied to a source of said first MOS transistor and a standard potential is supplied to a drain of said second MOS transistor;
   an inverter having a pair of cooperative MOS transistors having sources through which a signal is outputted to a gate of said second MOS transistor in response to an input of said switching circuit; and
   a level shifter which outputs a low or high potential to said first MOS transistor in response to said input of said switching circuit;
   wherein a source of said third MOS transistor is connected to a drain of said first MOS transistor, a drain of said third MOS transistor is connected to a source of said second MOS transistor, and a back gate of said third MOS transistor is connected to said output terminal, said output terminal located at a connection point of said drain of said third MOS transistor to said source of said second MOS transistor.

2. A power supply switching circuit according to claim 1, wherein said first, second and third MOS transistors are p-channel transistors, and wherein a high potential is supplied to said source of said first MOS transistor.

3. A power supply switching circuit according to claim 1, wherein said first, second and third MOS transistors are n-channel transistors, and wherein a low potential is supplied to said source of said first MOS transistor.

4. A power supply switching circuit according to claim 1, wherein said input is applied to a gate electrode of said third MOS transistor.

* * * * *